(12) United States Patent
Khouri et al.

(10) Patent No.: US 7,324,371 B2
(45) Date of Patent: Jan. 29, 2008

(54) METHOD OF WRITING TO A PHASE CHANGE MEMORY DEVICE

(75) Inventors: Osama Khouri, Milan (IT); Claudio Resta, Villa di Tirano (IT)

(73) Assignees: STMicroelectronics S.r.l., Agrate Brianza (IT); Ovonyx Inc., Boise, ID (US)

( * ) Notice: Subject to any disclaimer, the term of this patent is extended or adjusted under 35 U.S.C. 154(b) by 17 days.

(21) Appl. No.: 11/350,300

(22) Filed: Feb. 7, 2006

(65) Prior Publication Data

US 2006/0126381 A1    Jun. 15, 2006

Related U.S. Application Data

(60) Division of application No. 10/782,737, filed on Feb. 18, 2004, now Pat. No. 7,050,328, which is a continuation-in-part of application No. 10/331,185, filed on Dec. 27, 2002, now Pat. No. 6,754,107.

(30) Foreign Application Priority Data

Dec. 27, 2001  (EP) .................................. 01830808
Feb. 21, 2003  (EP) .................................. 03425098

(51) Int. Cl.
      G11C 11/00       (2006.01)
(52) U.S. Cl. .................... 365/163; 365/158; 365/171
(58) Field of Classification Search ................ 365/163, 365/154, 158, 171
      See application file for complete search history.

(56) References Cited

U.S. PATENT DOCUMENTS

| 5,576,990 A | 11/1996 | Camerlenghi et al. . | 365/185.23 |
|---|---|---|---|
| 5,610,860 A | 3/1997 | Rouy | 365/185.18 |
| 5,694,356 A | 12/1997 | Wong et al. | 365/185.03 |
| 5,729,162 A | 3/1998 | Rouy | 327/103 |
| 5,883,827 A | 3/1999 | Morgan | 365/100 |
| 6,061,295 A | 5/2000 | Roh | 365/233 |

(Continued)

FOREIGN PATENT DOCUMENTS

EP    0 745 995 A1    12/1996

(Continued)

OTHER PUBLICATIONS

Hwang, Y. et al., "Completely CMOS-Compatible Phase-Change Nonvolatile RAM Using NMOS Cell Transistors," in *Proceedings of the Non-Volatile Semiconductor Memory Workshop NVMW 2003*, Monterey, CA., Feb. 16-20, 2003, pp. 91-92.

*Primary Examiner*—Pho M. Luu
(74) *Attorney, Agent, or Firm*—Lisa K. Jorgenson; Robert Iannucci; Seed IP Law Group PLLC

(57) ABSTRACT

A phase change memory has an array formed by a plurality of cells, each including a memory element of calcogenic material and a selection element connected in series to the memory element; a plurality of address lines connected to the cells; a write stage and a reading stage connected to the array. The write stage is formed by current generators, which supply preset currents to the selected cells so as to modify the resistance of the memory element. Reading takes place in voltage, by appropriately biasing the selected cell and comparing the current flowing therein with a reference value.

24 Claims, 9 Drawing Sheets

U.S. PATENT DOCUMENTS

| | | | |
|---|---|---|---|
| 6,141,253 A | 10/2000 | Lin | 365/185.28 |
| 6,462,984 B1 * | 10/2002 | Xu et al. | 365/175 |
| 6,487,113 B1 | 11/2002 | Park et al. | 365/163 |
| 6,590,807 B2 * | 7/2003 | Lowrey | 365/175 |
| 6,754,107 B2 | 6/2004 | Khouri et al. | 365/185.23 |
| 6,816,404 B2 | 11/2004 | Khouri et al. | 365/163 |

FOREIGN PATENT DOCUMENTS

| | | |
|---|---|---|
| EP | 0 776 012 A2 | 5/1997 |
| JP | 63-42097 | 2/1988 |

* cited by examiner

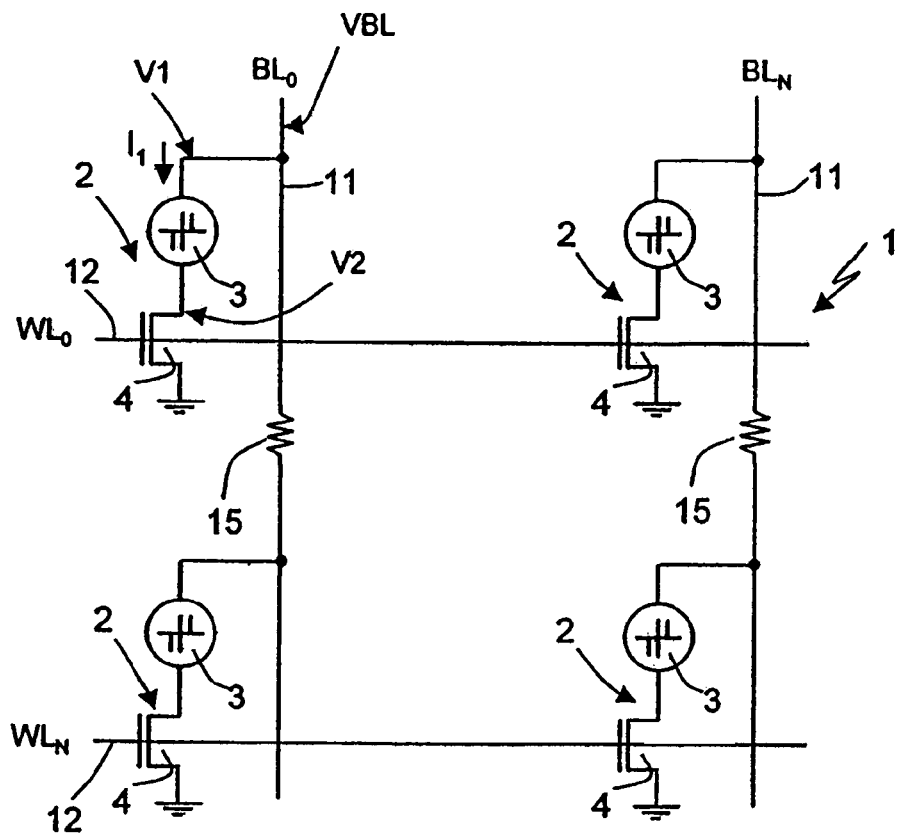
FIG. 3a *(Prior Art)*
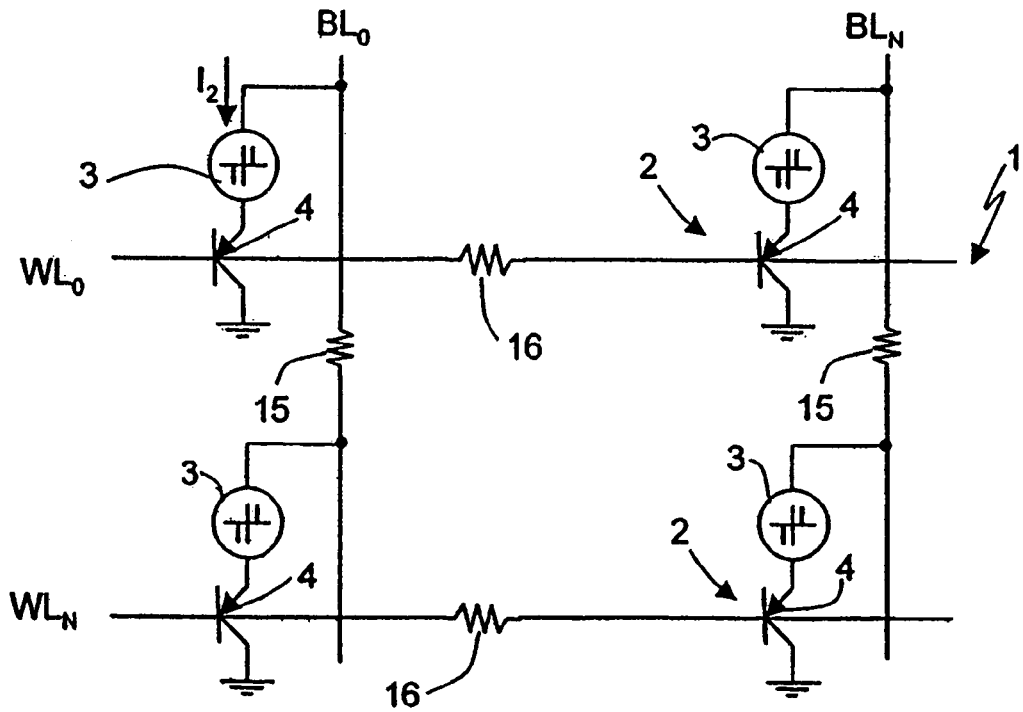
FIG. 3b *(Prior Art)*

METHOD OF WRITING TO A PHASE CHANGE MEMORY DEVICE

CROSS-REFERENCES TO RELATED APPLICATION

This application is a divisional of U.S. application Ser. No. 10/782,737 filed Feb. 18, 2004, now U.S. Pat. No. 7,050,328, which is a continuation-in-part of U.S. patent application Ser. No. 10/331,185, filed Dec. 27, 2002, now U.S. Pat. No. 6,754,107.

BACKGROUND OF THE INVENTION

1. Field of the Invention

The present invention relates to a phase change memory (PCM) device.

2. Description of the Related Art

As is known, phase change memory arrays are based upon memory elements which use a class of materials that have the property of switching between two phases having distinct electrical characteristics, associated to two different crystallographic structures of the material forming the memory element, and precisely an amorphous, disorderly phase and a crystalline or polycrystalline, orderly phase. The two phases are hence associated to resistivities of considerably different values.

Currently, the alloys of elements of group VI of the periodic table, such as Te or Se, referred to as calcogenides or calcogenic materials, can be used advantageously in phase change memory cells. The currently most promising calcogenide is formed from an alloy of Ge, Sb and Te ($Ge_2Sb_2Te_5$), which is now widely used for storing information on overwritable disks.

In the calcogenides, the resistivity varies by two or more orders of magnitude when the material passes from the amorphous (more resistive) phase to the crystalline (more conductive) phase, and vice versa. In the amorphous state, moreover, the resistivity depends to a marked extent upon the temperature, with variations of approximately one order of magnitude every 100° C. with a behavior typical of P-type semiconductors.

Phase change can be obtained by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the calcogenide back to the amorphous state it is necessary to raise the temperature above the melting temperature (approximately 600° C.) and then cool it off rapidly.

From the electrical standpoint, it is possible to reach the crystallization and melting temperatures by causing a current to flow through a crystalline resistive element that heats the calcogenic material by the Joule effect. FIG. 1 illustrates, in a simplified way, the behavior of the resistance of a calcogenic material as a function of the heating current and the logic values associated thereto, wherein $R_R$ indicates the resistance corresponding to the amorphous state (reset state or logic "0") and $R_S$ indicates the resistance corresponding to the crystalline or polycrystalline state (set state or logic "1").

The overall structure of a phase change memory is shown in FIG. 2. The memory array 1 of FIG. 2 comprises a plurality of memory cells 2, each including a memory element 3 of a phase change type and a selection element 4 formed here by an NMOS transistor. Alternatively, the selection element 4 may be formed by a bipolar junction transistor or a PN diode.

The memory cells 2 are arranged in rows and columns. In each memory cell 2, the memory element 3 has a first terminal connected to an own bitline 11 (with addresses BLn−1, BLn, BLn+1, . . . ), and a second terminal connected to a first conduction terminal of an own selection element 4. The selection element 4 has a control terminal connected to an own control line, also referred to as wordline 12 (with addresses WLn−1, WLn, WLn+1, . . . ), and a second conduction terminal connected to ground.

For selecting the memory element 3 belonging to a specific cell 2, for example the one connected to the bitline BLn and to the wordline WLn, the bitline 11 and the wordline 12 connected to the addressed cell (selected bitline BLn and selected wordline WLn) are brought to a high voltage so that the first terminal of the memory element 3 is biased at a first voltage V1 and the second terminal is biased at a second voltage V2 close to zero.

In conformance with the indicated resistance values, by reset operation the operation is meant that is performed for obtaining a reset cell (resistance $R_R$) and by set operation the operation is meant that is performed for obtaining a set cell (resistance $R_S$).

Writing a bit in a two-level cell is obtained by causing a current pulse of constant duration and amplitude to flow in the cell both for the set and the reset operation.

Because of the array configuration shown in FIG. 2, writing and reading a selected cell present criticalities. In fact, the cells 2 are in series to a bitline resistance RBL, designated by 15 in FIG. 3a. The bitline resistance RBL is a function of the topological position of the cell 2 along the bitline 11. In particular, the resistance RBL is zero for the cells 2 connected to the first wordline 12 (WL<0>) and is maximum for the cells 2 connected to the last wordline 12 (WL<N>).

Should a write operation be performed with a fixed biasing voltage (voltage VBL in FIG. 3a), the current flowing in the memory element 3 depends upon the topological position of the cell 2 to be written, i.e., upon the resistance RBL. In particular, if the cell 2 to be written is connected to the first wordline 12 (WL<0>), the voltage V1 applied to the first terminal is equal to VBL and thus determines a current I1 equal to:

$$I1=(VBL-V2)/Rc$$

where Rc is the resistance of the memory element 3. If, instead, the cell 2 to be written is connected to the last wordline 12 (WL<N>), the current I2 flowing in the cell is equal to:

$$I2=(VBL-V2)/(Rc+RBL)$$

which is less than I1.

The resistance value of each cell 2 after writing thus depends upon the position of the cell along the respective bitline 11, thus determining a spreading of the distribution of the resistances Rc of the cells 2.

If the selection element 4 is formed by a bipolar junction transistor instead of a MOS-type transistor, the dependence of the write current upon the topological position of the selected cell is even more marked, because the current flowing in the memory element 3 depends also upon the resistance of the wordline, as shown in FIG. 3b, where the wordline resistance is designated by 16 and is equal to RWL.

The above determines a further spreading of the distribution of the resistance values of the cells 2. On the other hand, having wide distributions of cell resistance leads to problems both during reading and during writing.

In fact, when a cell 2 is to be read that is in the reset state without damaging the information content thereof, it is necessary to apply across its memory element 3 a voltage V1-V2 that is not higher than a threshold voltage Vth, beyond which the memory element 3 can pass from the reset state (high reset resistance $R_R$, see FIG. 1) to the set state (low set resistance $R_S$). In practice, with current technologies and materials, threshold voltage Vth is about 1 V.

In the transition from the low field, low voltage range of operation up towards the threshold voltage Vth, the phase change device current increases faster than linear and becomes exponential in the region around Vth. The device current at Vth is defined as Ith. In order to be able to read a reset cell 2 by supplying a current in the cell without exceeding the threshold voltage Vth, it is necessary to supply a current less than Ith with sufficient operating margin. Ith for practical devices is in the range of 1-2% of the reset current. This translates to 5-10 µA and going lower for modern devices.

The generation of a precise read current of the order of magnitude of 1 µA begins to get complicated, in so far as for such values problems arise linked to process variations (mismatch, threshold voltage), temperature variations, etc.

Furthermore, with this current value, the resultant voltage across a reset cell having reset resistance $R_R$=100 kΩ is equal to 100 mV. To distinguish therefore a set cell from a reset cell, there exists a margin of just 50 mV, intermediate between the above indicated voltage of 100 mV for reset resistance $R_R$=100 kΩ and the resultant voltage for a set cell (close to 0 V). Providing additional margin, such as for example to limit to about 0.4-0.6 V the maximum voltage applied to the memory element during reading, greatly reduces these sense voltage differentials.

BRIEF SUMMARY OF THE INVENTION

One embodiment of the invention solves the problem referred to above, reducing the width of the distribution of the resistance values of the phase change cells after writing, so that during reading it will be simpler to discriminate between set cells and reset cells.

According to one embodiment of the invention, writing of the memory cells takes place by supplying a preset current, according to the desired modification operation, reading of the cells is performed by applying a biasing voltage to the selected cells. In this way, during writing, the topological position of the selected cell does not affect the value of the current flowing in the selected cell and thus in its memory element. During reading, instead, the selected cell is biased by a voltage, thus enabling easier reading and the production of simpler sense circuits.

BRIEF DESCRIPTION OF THE DRAWINGS

For a better understanding of the present invention, there are now described preferred embodiments, purely by way of non-limiting example, with reference to the attached drawings, wherein:

FIG. 3a illustrates an equivalent electrical circuit of an array in case of a selection element made as a MOS transistor;

FIG. 3b illustrates an equivalent electrical circuit of an array in case of a selection element made as a bipolar junction transistor;

DETAILED DESCRIPTION OF THE INVENTION

Figure 1:
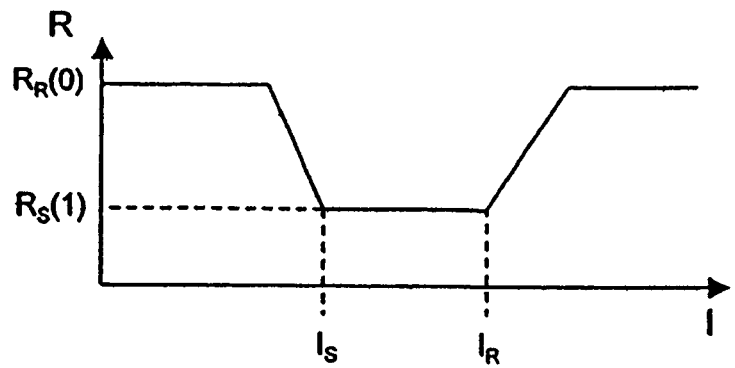
FIG. 1 shows the plot of the resistance in set PCM cells and reset PCM cells as a function of the current.
Figure 2:
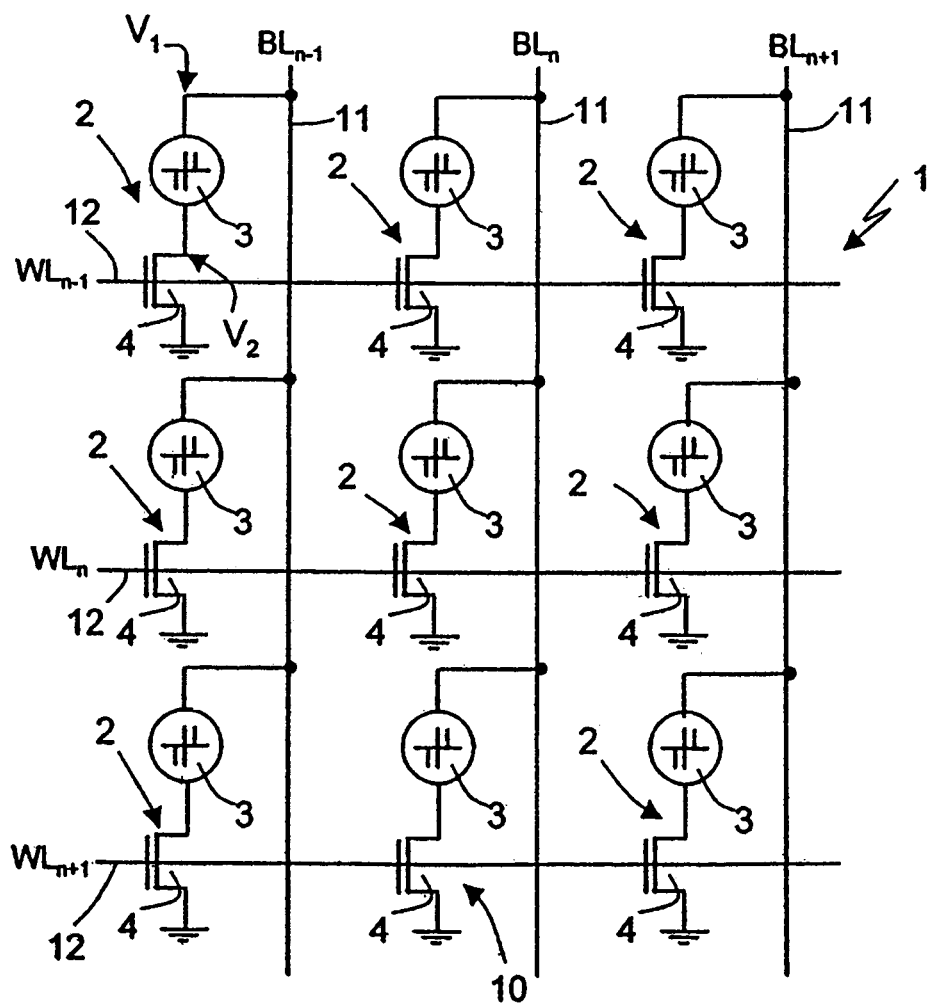
FIG. 2 is a circuit diagram of an array of PCM cells.
Figure 4:
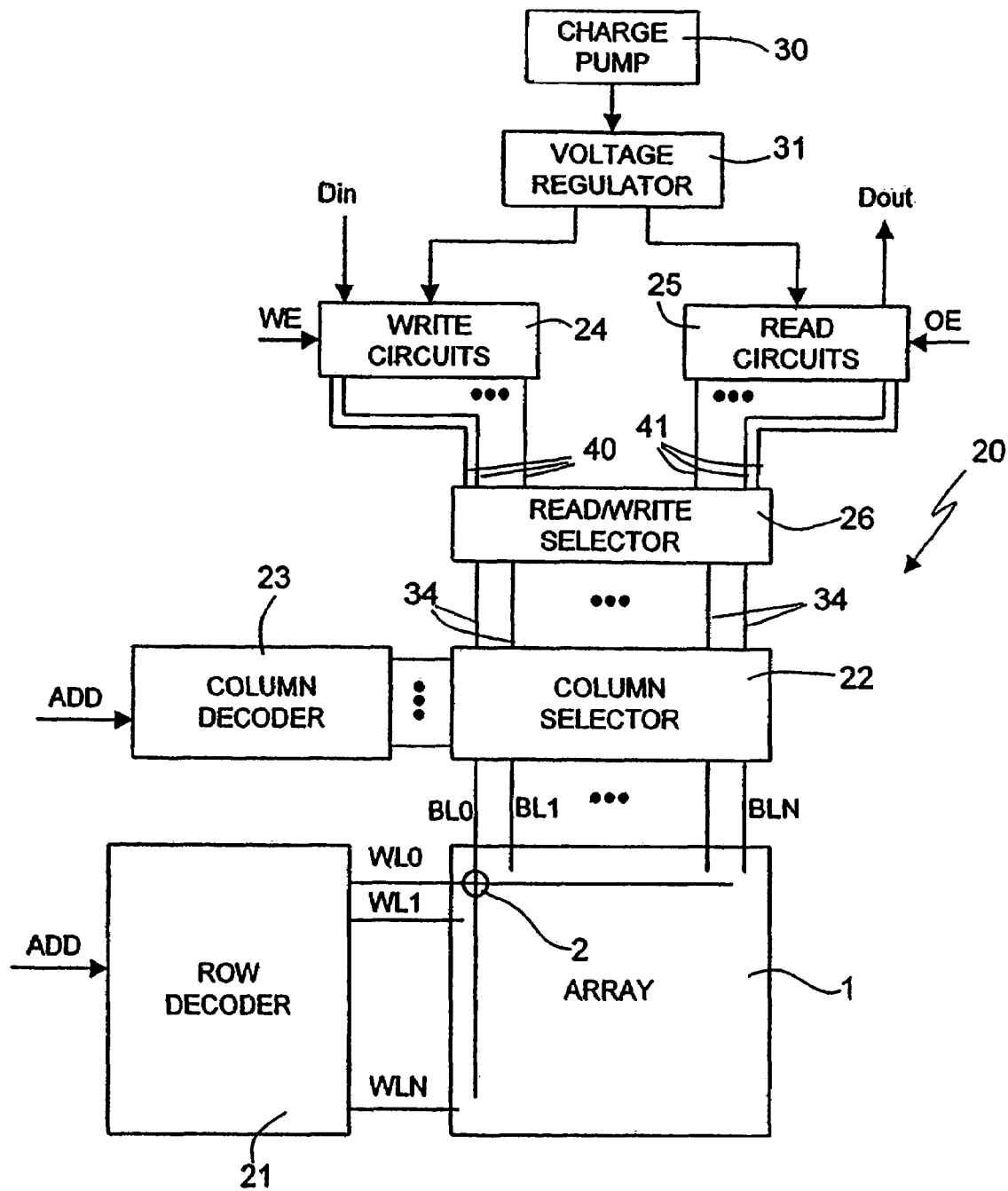
FIG. 4 illustrates a block diagram of an embodiment of the present memory device.
Figure 5:
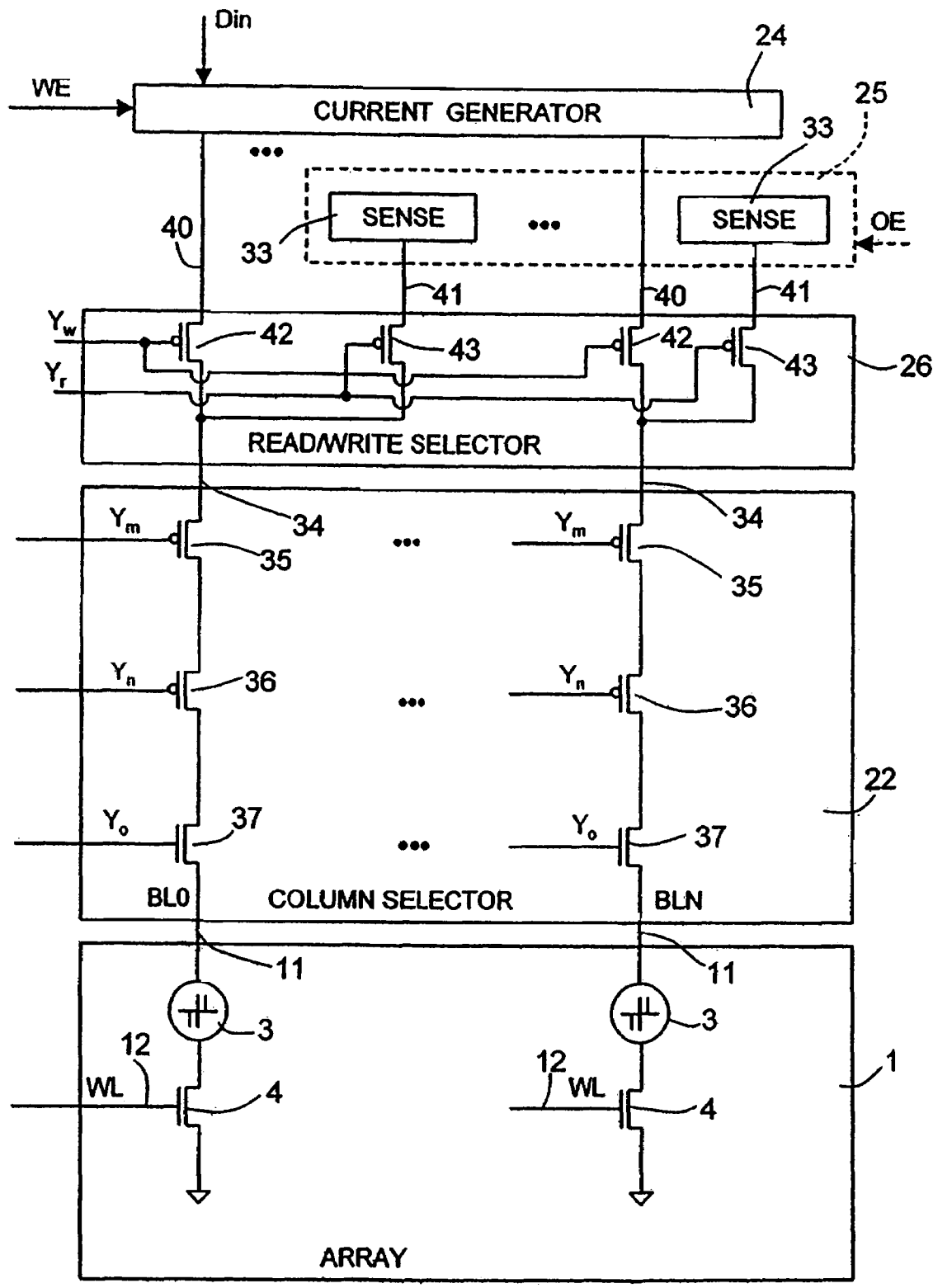
FIG. 5 illustrates a more detailed diagram of a part of the memory device of FIG. 4.

According to FIG. 4, a phase change memory (PCM) device 20 comprises a memory array 1 having the structure illustrated in FIGS. 2 and 3a or 3b, the cells 2 whereof (only one shown in a schematic way) are addressed through wordlines WL0, WL1, . . . , WLN extending from a row decoder 21 and through bitlines BL0, BL1, . . . , BLN, extending from a column selector 22, illustrated in greater detail in FIG. 5 and controlled by column selection signals supplied by a column decoder 23.

The column selector 22 is moreover selectively connected to a write stage 24 or to a read stage 25 through a read/write selector 26, shown in detail in FIG. 5. The write stage 24 (described in greater detail hereinbelow) generates the currents necessary for writing. To this end, it receives a write enable signal WE and input data Din, and supplies currents of appropriate value to the column selector 22. The latter supplies these currents to the bitlines BL selected according to the column selection signals supplied by the column decoder 23. The read stage 25, also described in greater detail hereinafter, has the function of reading the information content of the selected memory cells. To this end, it is enabled by an output enable signal OE and supplies output data Dout.

A charge pump block 30 generates, from the supply voltage, the operating voltages necessary for operation of the write circuit 24 and read circuit 25. A voltage regulator 31 arranged between the charge pump block 30 and the write and read stages 24, 25 stabilizes the operating voltages and generating the reference voltages necessary for biasing the circuits.

Figure 6:
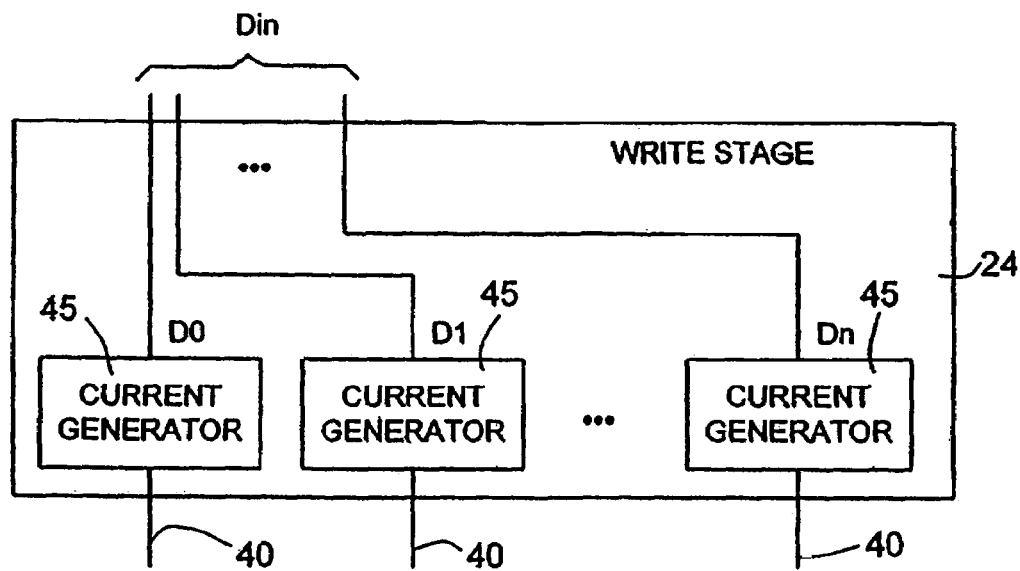
FIG. 6 is a block diagram of an element of the memory device of FIG. 4.

The write stage 24 can be formed by a single current generator that is mirrored by current mirror circuits of a known type to each bitline BL, as shown in FIG. 5. Alternatively, as many current generators can be provided as memory cells that are written simultaneously, as shown in FIG. 6.

Figure 9:
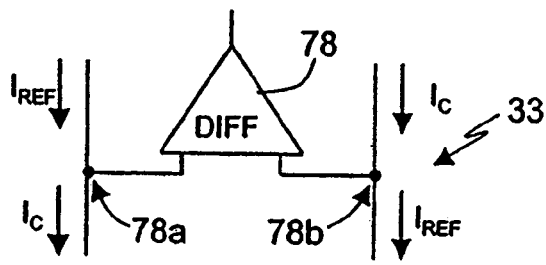
FIG. 9 illustrates a general diagram of another of the blocks of FIG. 6.
Figure 10:
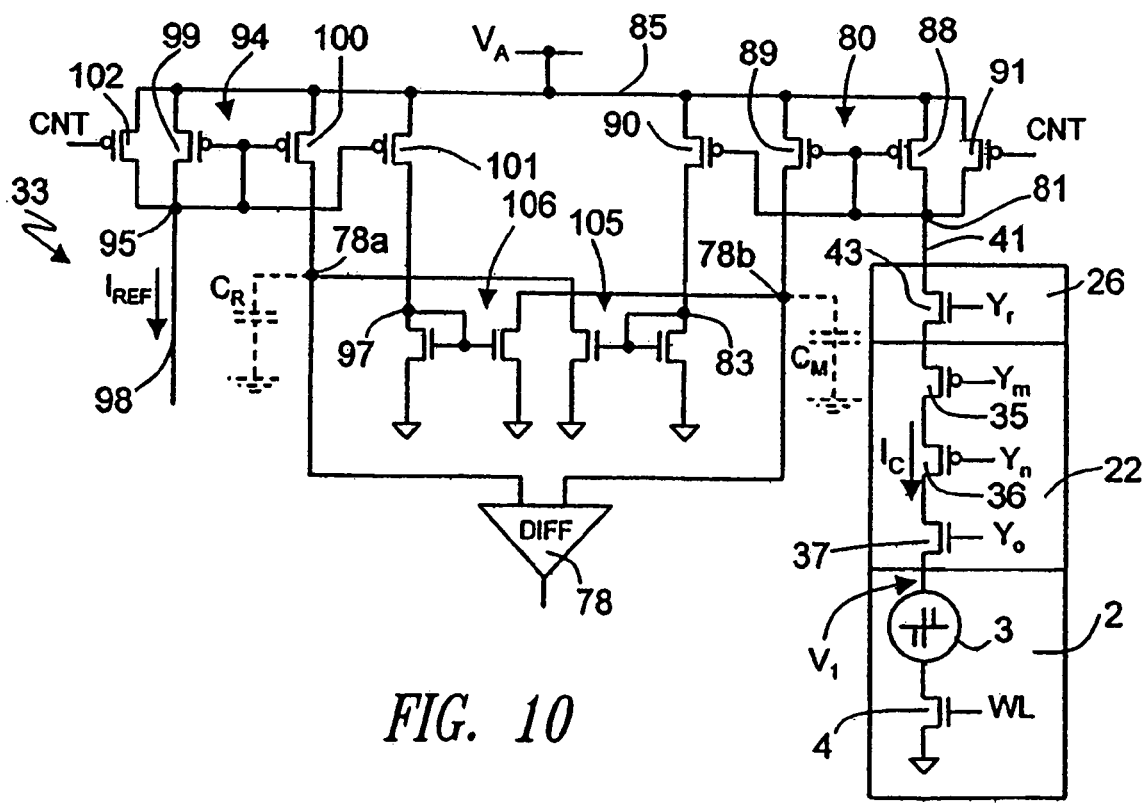
FIG. 10 illustrates a more detailed diagram of the block of FIG. 9.

The read stage 25 is instead formed by a plurality of sense circuits, illustrated in greater detail in FIGS. 9 and 10.

FIG. 5 illustrates a detailed diagram of a part of the PCM device 20 of FIG. 4, showing, in greater detail, the column selector 22 and the read/write selector 26. Moreover, in FIG. 5, a plurality of read circuits 33 is shown, which form the read stage 25. Instead, the write stage 24 is formed here by a single current generator.

In detail, the column selector 22 is formed by a plurality of selection switches implemented by NMOS or PMOS transistors, connected in series and controlled by respective column selection signals so as to connect each time some selected bitlines 11 (of a number equal to the number of cells that are read/written simultaneously) to as many biasing lines 34, in a per se known way. Furthermore, the column selector 22 has the function of appropriately biasing the selected bitlines 11, as explained below in detail. The number of selection switches forming the column selector 22 depends upon the dimensions of the memory array or of each sector of the latter and upon the memory organization. For example, in FIG. 5 each path between a biasing line 34 and a selected bitline 11 comprises two PMOS transistors 35 and 36, controlled by respective column selection signals Ym, Yn, and an NMOS transistor 37, controlled by a respective column selection signal Yo.

Each biasing line 34 is connected to an own write line 40 and to an own read line 41 through two PMOS transistors, indicated as a write transistor 42 and a read transistor 43. All the write transistors 42 are controlled by a same write enable signal Yw, and all the read transistors 43 are controlled by a same read enable signal Yr. The write lines 40 are connected to as many outputs of the current generator forming the write stage 24 (if just one, as shown in FIG. 5) or to a respective current generator 45, as shown in FIG. 6.

During writing, the write transistors 42 are on and the read transistors 43 are off. The PMOS transistors 35, 36 and the NMOS transistors 37 corresponding to the selected bitlines 11 (as well as the write transistors 42) are biased so as to reduce as much as possible the voltage drop across them; i.e., the signals Ym, Yn, Yw are brought low (for example to ground), and the signals Yo are brought high (to a value such as not to significantly limit the writing current). The current supplied to the memory element 3 is supplied by the write stage 24.

During reading, the read transistors 43 are turned on, and the write transistors 42 are turned off. Reading takes place in the way described in detail hereinafter with reference to FIGS. 9, 10.

With the configuration of the write stage 24 of FIG. 6, each current generator 45 generates a current (supplied to the respective write line 40), the value whereof depends upon the datum to be written. For example, in the case of a PCM device 20 of a two-level type, Din comprises a plurality of bits D0, D1, . . . , Di that can assume the logic value "0" or the logic value "1". If the bit Di is equal to "1", the corresponding current generator generates a set current; if instead the bit Di is equal to "0", a reset current is generated.

Figure 7:
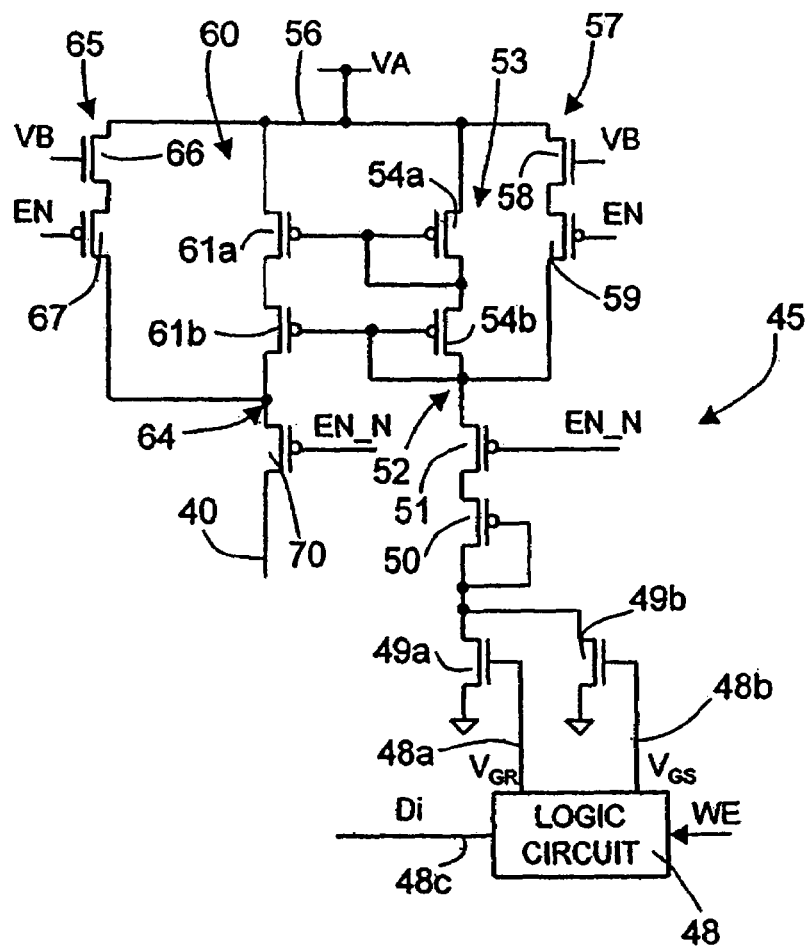
FIG. 7 illustrates a more detailed diagram of one of the blocks of FIG. 6.

FIG. 7 illustrates an embodiment of a current generator 45.

A logic circuit 48 has an input 48c receiving a respective bit Di and two outputs 48a, 48b supplying, respectively, a reset writing voltage $V_{GR}$ or a set writing voltage $V_{GS}$. The outputs 48a, 48b of the logic circuit 48 are connected to the gate terminal of a respective generator transistor 49a, 49b. The generator transistors 49a, 49b are of an NMOS type, have grounded source terminals and drain terminals connected together and to a first node 52, through a diode-connected PMOS transistor 50 and a first enabling transistor 51, of PMOS type, which receives an inverted enabling signal EN_N from a central processing unit of the PCM device 20 (not shown).

The first node 52 is connected to a first load branch 53, formed by two diode-connected PMOS transistors 54a, 54b coupled in series to each other between the first node 52 and a supply line 56 set at a voltage VA. A first biasing branch 57, formed by an NMOS transistor 58 and a PMOS transistor 59, is connected in parallel to the first load branch 53. The NMOS transistor 58 of the first biasing branch 57 receives a biasing voltage VB on its gate terminal. The PMOS transistor 59 of the first biasing branch 57 receives an enabling signal EN, opposite to the inverted enabling signal EN_N, on its gate terminal.

A second load branch 60 is connected between the supply line 56 and a second node 64. The second load branch 60 comprises two PMOS transistors 61a, 61b connected in series and having gate terminals connected to the gate terminals of the PMOS transistors 54a, and, respectively, 54b of the first load branch 53. A second biasing branch 65, similar to the first biasing branch 57, is connected in parallel to the second load branch 60. The second biasing branch 65 is formed by transistors 66, 67 similar to transistors 58, 59 of the first biasing branch 57.

The second node 64 is connected to the respective write line 40 through a second enabling transistor 70 similar to the first enabling transistor 51.

In the current generator 45 of FIG. 7, the generator transistors 49a, 49b operate as a current sources. They are turned on by the logic circuit 48 (which can be made up of simple switches, controlled by the bit Di as well as by the write enable signal WE). In practice, the logic circuit 48 supplies an appropriate voltage (for example the supply voltage Vcc) to the generator transistors 49a, 49b according to the bit (or more generically the datum) to be written. For example, if it is intended to write a "0" (reset operation, which requires a larger current than the set operation), both the generator transistors 49a, 49b are turned on. If, instead, it is intended to write a "1", only one of the generator transistors 49a, 49b is turned on. Alternatively, the two generator transistors 49a, 49b can be sized and/or biased so as to supply each only the set or the reset current. In this case, the generator transistors 49a, 49b are turned on alternately.

Figure 8:
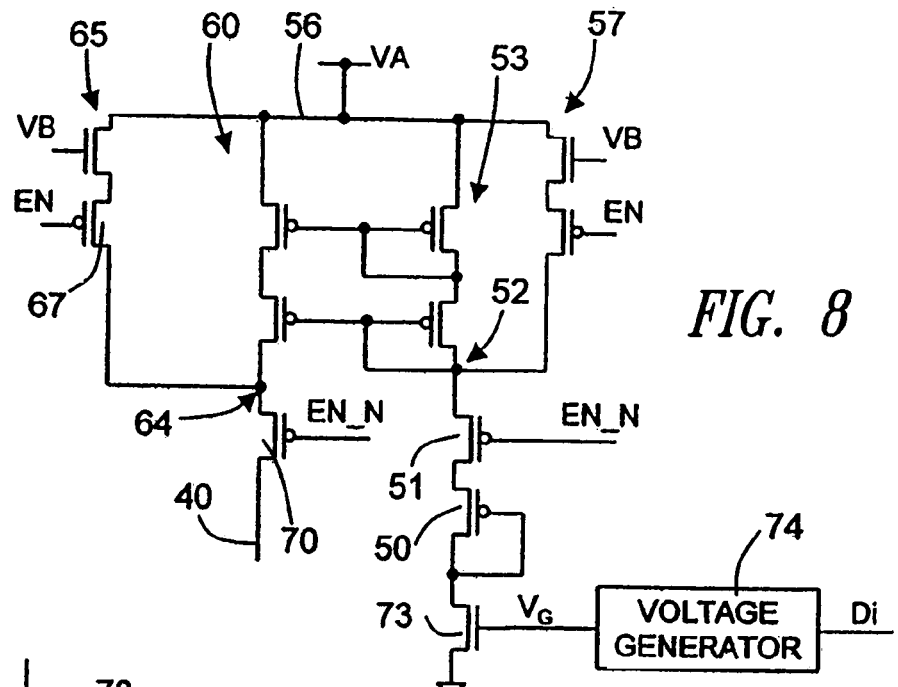
FIG. 8 illustrates a different embodiment of the block of FIG. 7.

The generator transistors 49a, 49b can be replaced by a single generator transistor, as shown in FIG. 8, wherein a generator transistor 73 has its gate terminal connected to a controlled voltage generator 74, which receives the datum or bit to be read Di and generates a control voltage VG having a variable value according to the datum or bit to be written Di and thus the set or reset operation requested.

In both FIGS. 7 and 8, the enable signal EN and the inverted enabling signal EN_N supplied to the transistors 51, 70, 59, 67 enable and disable the current generator 45 so as not to dissipate current when no write operations are performed, and are obtained from the write enable signal WE of FIG. 4. The biasing voltage VB supplied to the NMOS transistors 58 and 66 of the biasing branches 57, 60 is an appropriate voltage that has the function, when the current generator 45 is turned off, of suitably biasing the first and second nodes 52, 64 so as not to leave them floating.

The supply voltage VA is a boosted voltage appropriately regulated by the charge pump 30 and by the voltage regulator 31 (FIG. 4), or is supplied externally.

According to one embodiment of the invention, reading a memory cell 2 is performed by appropriately biasing its memory element 3 (FIG. 2) and comparing the current flowing in the bitline 11 connected to the selected memory cell 2 with an appropriate reference current. Advantageously, the comparison is made using a sense circuit 33 (FIG. 5) having the schematic circuit diagram of FIG. 9.

In FIG. 9, the read circuit 33 is formed by a differential circuit 78 of dual-input dynamics type. Consequently it has a first input connected to a first differential node 78a, where the difference between the reference current $I_{REF}$ and the current $I_C$ flowing in the selected cell is calculated, and a second input connected to a second differential node 78b, where the difference between the current flowing in the selected cell $I_C$ and the reference current $I_{REF}$ is calculated.

An embodiment of the read circuit 33 is shown in FIG. 10, where, for a better understanding, a connection path to a selected memory cell 2 to be read is shown.

In detail, a cell mirror circuit 80 is connected between a supply line 85 set at the voltage VA, a cell equalization node 81, the second differential node 78b and a first intermediate node 83. The cell equalization node 81 is connected to a read line 41.

The cell mirror circuit 80 comprises a cell input transistor 88 of PMOS type diode-connected between a supply line 85 and the cell equalization node 81, a first cell mirror transistor 89 of PMOS type connected between the supply line 85 and the second differential node 78b, and a second cell mirror transistor 90 of PMOS type connected between the supply line 85 and the first intermediate node 83. The transistors 88, 89 and 90 have the same structure, are obtained using with the same technology and have the same dimensions, and are consequently traversed by the same current, equal to the cell current $I_C$. A mirror switch-off transistor 91 is moreover connected between the supply line 85 and the cell equalization node 81 and receives, on its gate terminal, a control voltage CNT switching between $V_A$ and 0 V.

In addition, a reference mirror circuit 94 is connected between the supply line 85, a reference equalization node 95, the first differential node 78a and a second intermediate node 97. The reference equalization node 95 is connected to a reference line 98 connected to a reference cell (not shown) and carrying a reference current $I_{REF}$.

The reference mirror circuit 94 has a similar structure to the cell mirror circuit 80 and comprises a first reference input transistor 99 of PMOS type, diode-connected between the supply line 85 and the reference equalization node 95; a first reference mirror transistor 100 of PMOS type connected between the supply line 85 and the first differential node 78a and a second reference mirror transistor 101 of PMOS type connected between the supply line 85 and the second intermediate node 97. A mirror switch-off transistor 102 is moreover connected between the supply line 85 and the reference equalization node 95 and receives, on its gate terminal, the control voltage CNT.

A first mirror circuit 105, formed by NMOS transistors, is connected between the first intermediate node 83 and the first differential node 78a. A second mirror circuit 106, formed by NMOS transistors, is connected between the second intermediate node 97 and the second differential node 78b. First and second mirror circuits 105 and 106 may be switched off by mirror switch off transistors 91, 102 by bringing control voltage CNT to 0 V.

During reading, transistors 35-37 are turned on for selecting the bitline connected to the memory cell 2 to be read and for connecting it to the read circuit 26. The NMOS transistor 37 operates both as selector and as a fixing element for the read voltage V1. In fact, Yo=V1+Vth+Vov, where Vth is the threshold voltage (turning-on voltage) of NMOS transistor 37 and Vov is the overdrive voltage, which depends upon the current flowing in the NMOS transistor 37 and consequently upon the set or reset condition of the read memory cell 2. V1 is chosen so as not to modify the information content of the cell (for example, V1≅1 V). In practice, by fixing Yo, the voltage V1 is also fixed, except for the variation of Vov, which in any case is small as compared to V1 and Vth.

Consequently, the voltage Yo determines the biasing of the memory cell 2 selected at V1, so that, in the selected bitline 11, a current $I_C$ flows that depends upon the set or reset condition of the memory cell 2. The cell current $I_C$ is then mirrored to the first differential node 78a by the cell mirror circuit 80 (and precisely by the second cell mirror transistor 90) and by the first mirror circuit 105, and here is subtracted from the reference current $I_{REF}$ mirrored by the reference mirror circuit 94 (and precisely by the first reference mirror transistor 100).

Furthermore, the reference current $I_{REF}$ is mirrored to the second differential node 78b by the reference mirror circuit 94 (and precisely by the second reference mirror transistor 101) and by the second mirror circuit 106, and is subtracted from the cell current $I_C$ repeated by the cell mirror circuit 80 (and precisely by the first cell mirror transistor 89).

If, previously, the first and the second differential nodes 78a, 78b had been brought to the same biasing voltage by the equalization transistors not shown, the currents flowing in the first and second differential nodes 78a, 78b charge or discharge the parasitic capacitances $C_R$ and $C_M$ (represented by dashed lines) associated to the nodes. In particular, if the cell current $I_C$ is greater than the reference current $I_{REF}$, the voltage at the second differential node 78b rises rapidly, because the current $I_C-I_{REF}$ rapidly charges the capacitance $C_M$ associated thereto, whereas the voltage at the first differential node 78a drops rapidly, since the current $I_{REF}-I_C$ rapidly discharges the capacitance $C_R$ associated thereto.

Instead, if the reference current $I_{REF}$ is greater than the cell current $I_C$, the voltage at the first differential node 78a rises rapidly and the voltage at the second differential node 78b drops rapidly.

The differential 78 then compares the voltages on the differential nodes 78a and 78b and supplies the output datum.

Figure 11A:
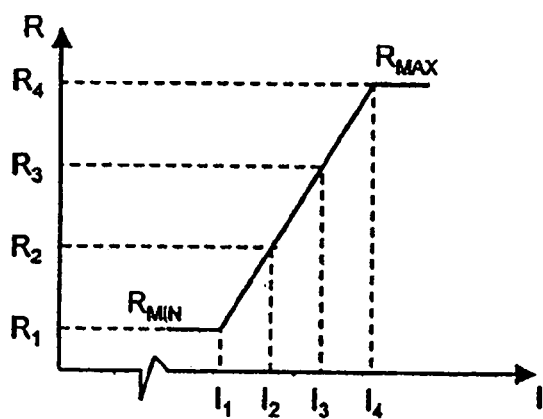
FIGS. 11a and 11b show the programmable resistance values in a memory cell of a multilevel type.

The read/write method described herein can be used for multilevel programming. To this end, different logic resistance values may be written in the memory element 3, with a statistical distribution that must be as narrow as possible around the desired value to be able to allocate precisely a preset number of levels in the window comprised between a minimum resistance value RMIN and a maximum resistance value RMAX of the memory element 3. Since the resistance of the memory element 3 is directly correlated to the programming current, it is possible to program the memory element 3 with different logic resistance values, using different programming currents. For example, as shown in FIG. 11a, from a set cell with resistance R1 (corresponding to RMIN and to the programming current I1), associated to the logic level 00, it is possible to obtain, by supplying currents I2, I3, and I4, further three logic resistance values R2, R3, and R4, respectively, each associated to a respective logic level 01, 10, 11. In this way it is possible to store two bits in each memory cell 2.

Figure 11B:
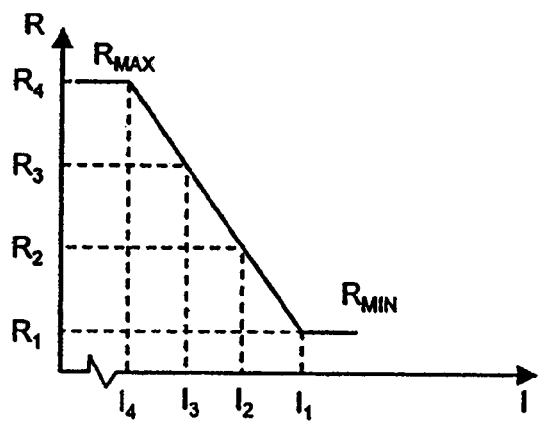

Likewise, starting from a reset cell having a resistance R4 corresponding to the logic level 11, it is possible to obtain the other logic resistance values R3, R2, R1, corresponding to the logic levels 10, 01, 00, supplying currents I3, I2, I1, as shown in FIG. 11b.

In the above case, the writing current generator must be able to supply the different current values necessary for programming the different resistance values.

The techniques for writing the PCM device 20 may be different.

According to a first solution, the current generator supplies a current of an increasing or decreasing value in a staircase way. After a current step has been applied, the resistance value (or the corresponding logic value) programmed in the memory element is verified. The programmed value is verified in the reading stage by comparison with an appropriate reference value (resistance, voltage or current). If the outcome of the comparison is negative, a new increasing/decreasing pulse is supplied until the desired value is reached.

Figure 12A:
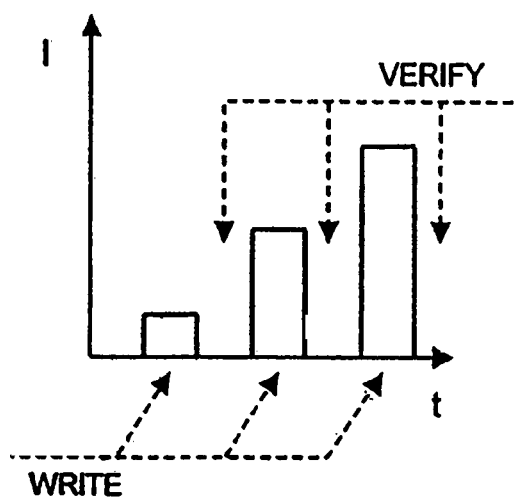
FIGS. 12a and 12b show two different writing sequences of memory cells of a multilevel type.
Figure 12B:
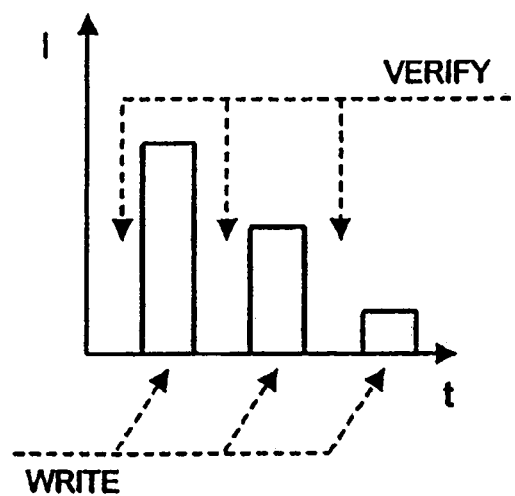
Figure 13:
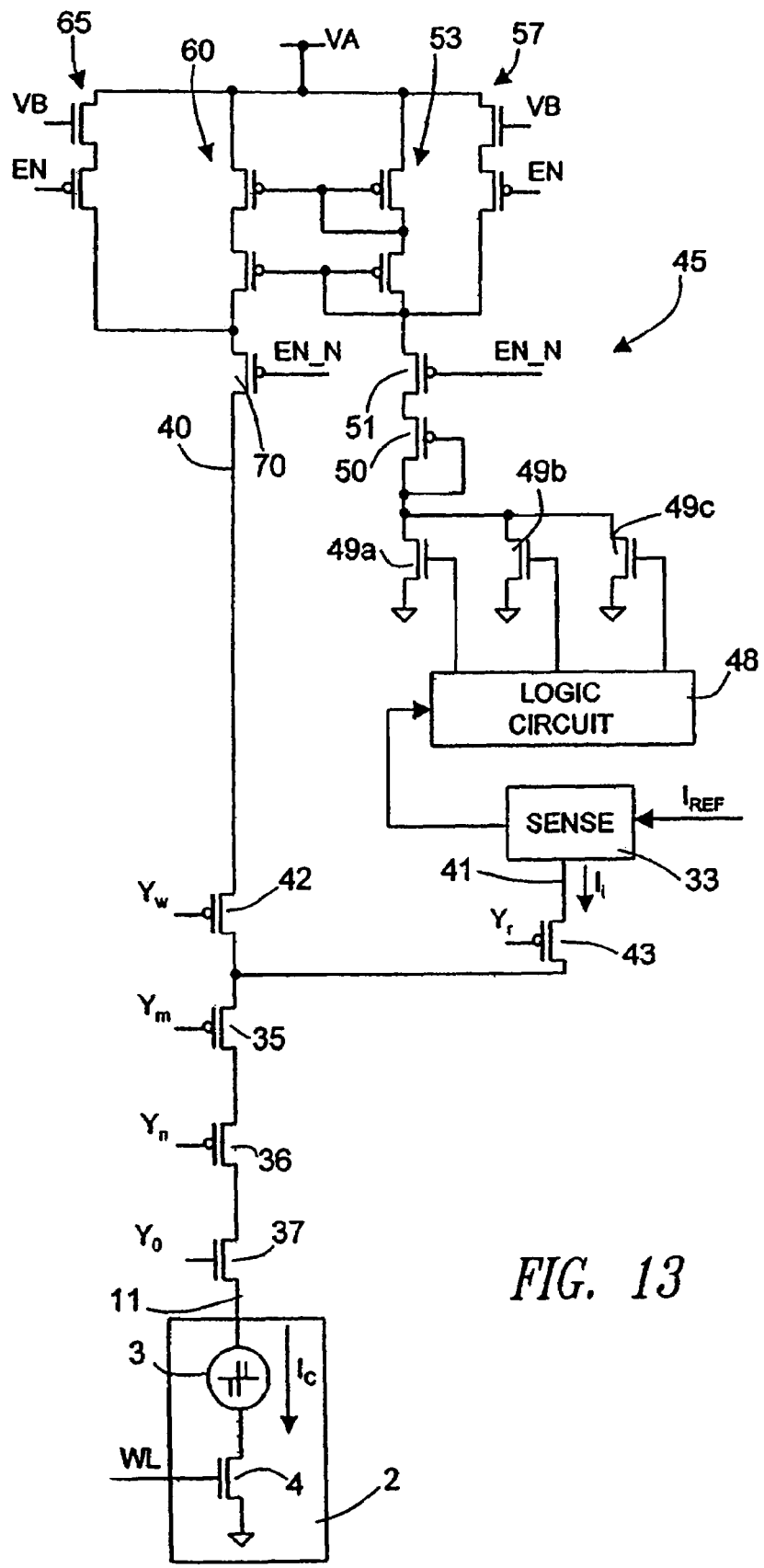
FIGS. 13-15 show electrical diagrams corresponding to a memory device of a multilevel type.

FIGS. 12a and 12b show two non-limiting examples of current staircases applied during writing, separated by verify steps. During writing, the transistors 35-37 and 42 are on and the transistors 43 are off (see for reference FIG. 13, similar to FIG. 5, wherein, however, just one selected bitline 11 is shown and the write circuit 45 and read circuit 33 associated thereto are shown in detail).

In addition, transistors 49a-49c are turned on selectively so as to obtain the desired currents. In particular, initially, a first current step is supplied, as shown in FIG. 12a or 12b.

Next, the verifying is performed. To this end, the write transistor 42 is turned off and the read transistor 43 is turned on. The NMOS transistor 37 enables biasing of the bitline 11 at the controlled read voltage VBL as described previously. Then, the read circuit 33 compares the current Ii flowing in the memory element 3 with the current $I_{REF}$ corresponding to the desired resistance value (or logic value). If the outcome of the verification is negative, the read circuit 33 again enables the write circuit 45, which sends a new current pulse, of increasing value, selectively and appropriately enabling the transistors 49a-49c. If, instead, the outcome of the verification is positive, the write algorithm is interrupted.

Alternatively, multilevel programming can be performed using a current generator that supplies the cell to be programmed with a current having a value corresponding to the desired level. For example, in the case of storage of two bits per memory cell 2, four current levels of a precise value are required, corresponding to four different resistance values of the memory element 3.

Figure 14:
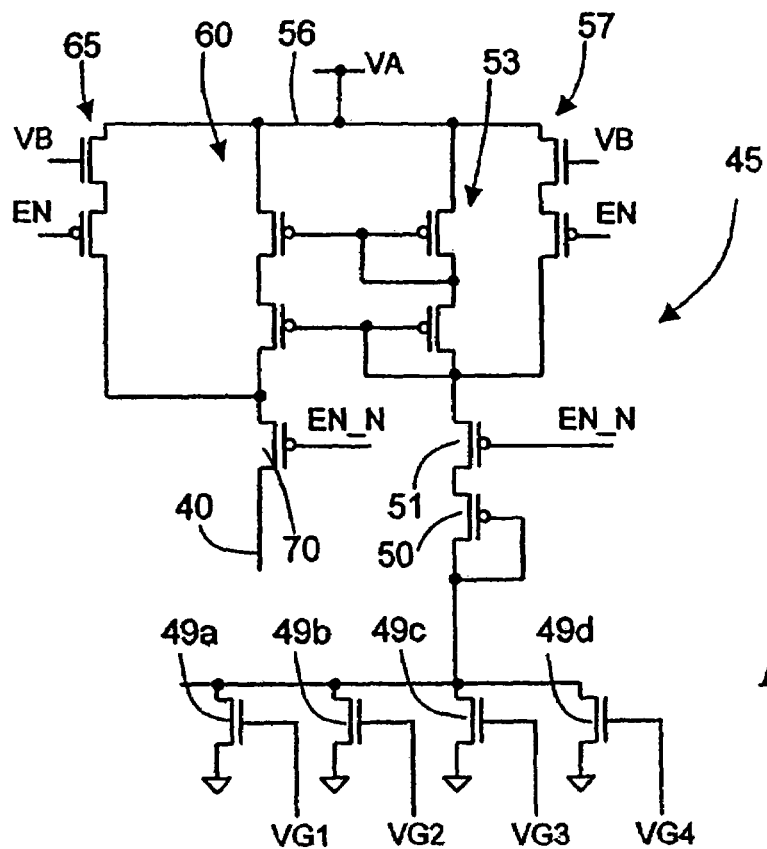

The implementation of a current generator for a multilevel memory is similar to that of a current generator for a two-level memory, illustrated in FIGS. 7 and 8. For example, FIG. 14 illustrates a current generator of a multilevel type 45, having four generator transistors 49a-49d, one for each logic level that it is intended to write, which are activated alternately, so that only one of the four generator transistors 49a-49d is activated at a given instant. Alternatively, they can be turned on in combination, to obtain the required current values.

Figure 15:
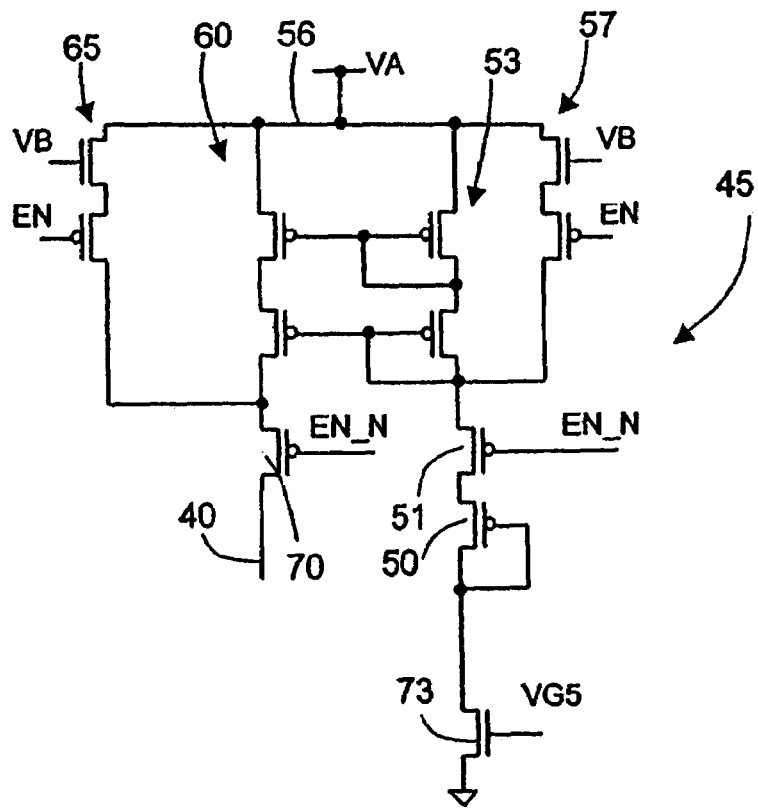

FIG. 15 illustrates a different solution, wherein a single transistor 73 (similarly to FIG. 8) is driven by a gate voltage VG5, the value whereof is determined by the desired current value and hence by the desired logic level.

The advantages of the memory device described herein are the following. Since the memory elements are written by supplying a preset current, the topological position of each cell within the array does not affect the programmed resistance value. It follows that it is possible to obtain narrow distributions of programmed resistance and thus easier reading. Since narrow resistance distributions are obtained, it is moreover possible to carry out multilevel programming, which would otherwise not be possible on account of the reading uncertainty.

The voltage biasing of the cells during reading enables simple operation. Reading is easier, and the read circuits can be made using simple structures. The device is thus, as a whole, reliable and inexpensive.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

Finally, it is clear that numerous modifications and variations can be made to the PCM device described and illustrated herein, all of which fall within in the scope of the invention, as defined in the annexed claims.

The invention claimed is:

1. A method, comprising:
   writing to a phase change memory device that includes a memory array, formed of a plurality of memory cells each including a memory element of calcogenic material and a selection element connected to the memory element, the writing including:
   determining that a selected one of said memory cells is desired to be written to; and
   supplying the selected one of said memory cells with a controlled current having a value modifying an electrical property of the memory element of said selected memory cell, wherein said supplying step comprises supplying the selected one of said memory cells with a plurality of current pulses, wherein said pulses have an increasing amplitude when modifying said electrical property in a first direction and a decreasing amplitude when modifying said electrical property in a second direction, opposite to said first direction.

2. The method according to claim 1 wherein after applying each pulse, the method includes:
   reading the selected one of the memory cells for verifying said electrical property;
   generating a cell signal proportional to a value of said electrical property;
   comparing said cell signal with a desired value; and
   applying a subsequent current pulse only if said cell signal has a preset relation with said desired value.

3. The method according to claim 1, further comprising reading the selected memory cell by the steps of biasing an address line connected to said selected memory cell at a read voltage, detecting a cell current flowing in said selected memory cell, and comparing said cell current with a reference current.

4. The method according to claim 3 wherein said step of comparing comprises generating a first voltage signal proportional to the difference between said cell current and said reference current; generating a second voltage signal proportional to the difference between said reference current and said cell current; and comparing said first and second signals through a differential amplifier.

5. A method, comprising:
   writing to a phase change memory device that includes a memory array formed by rows and columns of memory cells, each memory cell comprising a memory element of calcogenic material and a selection element connected to the memory element, the writing including;
   determining that a selected one of said memory cells is desired to be written to; and supplying the selected memory cell with a current having a value that modifies an electrical property of the selected memory cell, the supplying step ensuring that the value of the current does not depend on a position of the selected memory cell within the column in which the selected memory cell is positioned.

6. The method according to claim 5 wherein said supplying step comprises supplying the selected memory cell with a plurality of current pulses.

7. The method according to claim 6 wherein said pulses have an increasing amplitude when modifying the electrical property in a first direction and a decreasing amplitude when modifying the electrical property in a second direction, opposite to the first direction.

8. The method according to claim 6 wherein after applying each pulse, the method includes:
reading the selected memory cell to verify the electrical property;
generating a cell signal proportional to a value of the electrical property;
comparing the cell signal with a desired value; and
applying a subsequent current pulse only if the cell signal has a preset relation with the desired value.

9. The method according to claim 5, further comprising reading the selected memory cell by biasing an address line connected to the selected memory cell at a read voltage, detecting a cell current flowing in the selected memory cell, and comparing the cell current with a reference current.

10. The method according to claim 9 wherein the comparing comprises generating a first voltage signal proportional to the difference between the cell current and the reference current; generating a second voltage signal proportional to the difference between the reference current and the cell current; and comparing the first and second signals through a differential amplifier.

11. A method, comprising:
writing to a phase change memory device that includes a memory array formed by rows and columns of memory cells, each memory cell comprising a memory element of calcogenic material and a selection element connected to t e memory element, the writing including:
determining that a selected one of said memory cells is desired to be written to; and
supplying the selected memory cell with a current having a value that modifies an electrical property of the selected memory cell, the supplying step providing a voltage to the selected memory cell that depends on a position of the selected memory cell within the column in which the selected memory cell is positioned, wherein said supplying step comprises supplying the selected memory cell with a plurality of current pulses, wherein said pulses have an increasing amplitude when modifying the electrical property in a first direction and a decreasing amplitude when modifying the electrical property in a second direction, opposite to the first direction.

12. The method according to claim 11 wherein after applying each pulse, the method includes:
reading the selected memory cell to verify the electrical property;
generating a cell signal proportional to a value of the electrical property;
comparing the cell signal with a desired value; and
applying a subsequent current pulse only if the cell signal has a preset relation with the desired value.

13. The method according to claim 11, further comprising reading the selected memory cell by biasing an address line connected to the selected memory cell at a read voltage, detecting a cell current flowing in the selected memory cell, and comparing the cell current with a reference current.

14. The method according to claim 13 wherein the comparing comprises generating a first voltage signal proportional to the difference between the cell current and the reference current; generating a second voltage signal proportional to the difference between the reference current and the cell current; and comparing the first and second signals through a differential amplifier.

15. A method, comprising:
writing to a phase change memory device that includes a memory array, formed of a plurality of memory cells each including a memory element of calcogenic material and a selection element connected to the memory element, the writing including:
determining that a selected one of said memory cells is desired to be written to; and
supplying the selected one of said memory cells with a controlled current having a value modifying an electrical property of the memory element of said selected memory cell, wherein said supplying step comprises supplying the selected one of said memory cells with a plurality of current pulses, wherein after applying each pulse, the method includes:
reading the selected one of the memory cells for verifying said electrical property;
generating a cell signal proportional to a value of said electrical property;
comparing said cell signal with a desired value; and
applying a subsequent current pulse only if said cell signal has a preset relation with said desired value.

16. The method according to claim 15, further comprising reading the selected memory cell by steps including biasing an address line connected to said selected memory cell at a read voltage, detecting a cell current flowing in said selected memory cell, and comparing said cell current with a reference current.

17. The writing method according to claim 16 wherein said step of comparing said cell current with a reference current comprises generating a first voltage signal proportional to the difference between said cell current and said reference current; generating a second voltage signal proportional to the difference between said reference current and said cell current; and comparing said first and second signals through a differential amplifier.

18. A method, comprising:
writing to a phase change memory device that includes a memory array, formed of a plurality of memory cells each including a memory element of calcogenic material and a selection element connected to the memory element, the writing including:
determining that a selected one of said memory cells is desired to be written to; and
supplying the selected one of said memory cells with a controlled current having a value modifying an electrical property of the memory element of said selected memory cell; and
reading the selected memory cell by steps including biasing an address line connected to said selected memory cell at a read voltage, detecting a cell current flowing in said selected memory cell, and comparing said cell current with a reference current.

19. The method according to claim 18 wherein said step of comparing said cell current with a reference current comprises generating a first voltage signal proportional to the difference between said cell current and said reference current; generating a second voltage signal proportional to the difference between said reference current and said cell current; and comparing said first and second signals through a differential amplifier.

20. A method, comprising:
    writing to a phase change memory device that includes a memory array formed by rows and columns of memory cells, each memory cell comprising a memory element of calcogenic material and a selection element connected to the memory element, the writing including:
    determining that a selected one of said memory cells is desired to be written to; and
    supplying the selected memory cell with a current having a value that modifies an electrical property of the selected memory cell, the supplying step providing a voltage to the selected memory cell that depends on a position of the selected memory cell within the column in which the selected memory cell is positioned, wherein said supplying step comprises supplying the selected memory cell with a plurality of current pulses, wherein after applying each pulse, the method includes:
    reading the selected memory cell to verify the electrical property;
    generating a cell signal proportional to a value of the electrical property;
    comparing the cell signal with a desired value; and
    applying a subsequent current pulse only if the cell signal has a preset relation with the desired value.

21. The method according to claim 20, further comprising reading the selected memory cell by biasing an address line connected to the selected memory cell at a read voltage, detecting a cell current flowing in the selected memory cell, and comparing the cell current with a reference current.

22. The method according to claim 21 wherein comparing the cell current with a reference current comprises generating a first voltage signal proportional to the difference between the cell current and the reference current; generating a second voltage signal proportional to the difference between the reference current and the cell current; and comparing the first and second signals through a differential amplifier.

23. A method, comprising:
    writing to a phase change memory device that includes a memory array formed by rows and columns of memory cells, each memory cell comprising a memory element of calcogenic material and a selection element connected to the memory element, the writing including:
    determining that a selected one of said memory cells is desired to be written to; and
    supplying the selected memory cell with a current having a value that modifies an electrical property of the selected memory cell, the supplying step providing a voltage to the selected memory cell that depends on a position of the selected memory cell within the column in which the selected memory cell is positioned; and
    reading the selected memory cell by biasing an address line connected to the selected memory cell at a read voltage, detecting a cell current flowing in the selected memory cell, and comparing the cell current with a reference current.

24. The method according to claim 23 wherein the comparing comprises generating a first voltage signal proportional to the difference between the cell current and the reference current; generating a second voltage signal proportional to the difference between the reference current and the cell current; and comparing the first and second signals through a differential amplifier.

* * * * *

UNITED STATES PATENT AND TRADEMARK OFFICE
CERTIFICATE OF CORRECTION

PATENT NO. : 7,324,371 B2  
APPLICATION NO. : 11/350300  
DATED : January 29, 2008  
INVENTOR(S) : Osama Khouri et al.

It is certified that error appears in the above-identified patent and that said Letters Patent is hereby corrected as shown below:

Column 10  
Line 65, "to the memory element, the writing including;" should read as -- to the memory element, the writing including: --

Column 11  
Line 41, "to t e memory element, the writing including:" should read as -- to the memory element, the writing including: --

Signed and Sealed this

Second Day of June, 2009

JOHN DOLL  
*Acting Director of the United States Patent and Trademark Office*